(12) United States Patent
Miller et al.

(10) Patent No.: US 6,429,683 B1
(45) Date of Patent: Aug. 6, 2002

(54) LOW-POWER CMOS DIGITAL VOLTAGE LEVEL SHIFTER

(75) Inventors: Darrin C. Miller, Fort Collins; Brian C Miller, Ft Collins, both of CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 217 days.

(21) Appl. No.: 09/640,259

(22) Filed: Aug. 16, 2000

(51) Int. Cl.[7] .................. H03K 19/0185; H02M 3/155
(52) U.S. Cl. ............................ 326/80; 326/81; 326/68; 363/60
(58) Field of Search .................. 363/60, 131, 132; 326/62, 63, 68, 80, 81; 327/108, 333

(56) References Cited

U.S. PATENT DOCUMENTS

| | | | |
|---|---|---|---|
| 4,053,821 A | * 10/1977 | Hose, Jr. et al. ............. 363/60 |
| 4,486,670 A | 12/1984 | Chan et al. .................. 307/264 |
| 4,501,978 A | 2/1985 | Gentile et al. ............... 307/475 |
| 5,742,183 A | 4/1998 | Kuroda ........................ 326/81 |
| 5,760,620 A | * 6/1998 | Doluca .................. 327/108 X |
| 6,005,432 A | 12/1999 | Guo et al. ................... 327/333 |

* cited by examiner

*Primary Examiner*—Jessica Han
(74) *Attorney, Agent, or Firm*—Kyle J. Way

(57) ABSTRACT

An apparatus and method of shifting a low-voltage-swing digital signal to a signal of the same polarity with a relatively higher voltage swing are described which eliminate static current consumption by way of a feedback circuit and a pull-up device. By the use of embodiments according to the invention, little power is consumed, and hot electron injection as a mechanism for FET degradation is of little concern. Additionally, no specialized reference voltage is necessary, and precise layout of the circuit is not critical to proper circuit performance.

27 Claims, 2 Drawing Sheets

LOW-POWER CMOS DIGITAL VOLTAGE LEVEL SHIFTER

BACKGROUND OF THE INVENTION

Over the last few years, CMOS-based (complementary metal-oxide-semiconductor) digital logic IC (integrated circuit) technologies have been devised which operate at progressively lower power supply voltages with each passing design generation. Lower supply voltages dictate lower voltage swings for the associated digital signals, which typically traverse between ground and the power supply voltage. The benefits of using lower supply voltages are lower power consumption and faster signal switching times. However, along with these advantages comes the consequence of lower noise margins. CMOS logic IC power supply voltages currently available include, for example, 3.3 V, 2.5 V, 1.8 V, and 1.5 V. Depending on the application, a mix of the various CMOS technologies may be used in any particular electronic product, necessitating the use of digital voltage level shifters to translate CMOS signals generated using one power supply voltage to signals based on a different voltage level.

With respect to transforming a low-voltage-swing digital signal to a higher-voltage-swing signal, various types of CMOS voltage level shifters have been devised over the last few years. One simple example is depicted in FIG. 1, utilizing a pair of complementary MOS FETs (Field Effect Transistors) structured as CMOS inverters. A P-FET (p-channel FET) $P_{IN}$, and an N-FET (n-channel FET) $N_{IN}$, form an input signal inverter 100, and another pair of complementary FETs, a P-FET $P_{OUT}$ and an N-FET $N_{OUT}$, make up an output signal inverter 110. With such a circuit, an input signal $V_{IN}$ with a voltage swing between ground and a low power supply voltage $V_{DDL}$, is converted to an output signal $V_{OUT}$, with a voltage swing between ground and a high power supply voltage $V_{DDH}$. Input signal $V_{IN}$ is passed to input signal inverter 100, which logically inverts input signal $V_{IN}$ to the opposite polarity at a node 120. The signal at node 120 is then inverted once again by output signal inverter 110 to yield output signal $V_{OUT}$ that is of the same polarity as $V_{IN}$, but possesses a higher voltage swing.

Normally, the two FETS of a CMOS inverter, such as those in FIG. 1, will work in tandem so that one FET is completely "ON", or conducting current between the drain and source terminals of the FET, while the other is "OFF". When $V_{IN}$ is at a logic LOW of approximately zero volts, for example, FET $N_{IN}$ will be OFF, while FET $P_{IN}$ will be fully ON, causing node 120 to be pulled up substantially to voltage $V_{DDH}$. This voltage at node 120, in turn, causes FET $P_{OUT}$ to turn OFF completely, while $N_{OUT}$ is fully ON, causing $V_{OUT}$ to be pulled down essentially to ground. However, in the case where $V_{IN}$ is at a HIGH logic state of $V_{DDL}$ volts, $N_{IN}$ is ON, while $P_{IN}$ is partially ON. $P_{IN}$ is not completely OFF in this case since the voltage at the gate of $P_{IN}$ is not as high as the $V_{DDH}$ volts imposed on the drain of $P_{IN}$. Having both $P_{IN}$ and $N_{IN}$ ON results in a static current flowing from high power supply voltage $V_{DDH}$ to ground through input signal inverter 100. Having such static current flowing during a time when no signal transitions are occurring causes increased power consumption and unwanted heat generation by the circuit. Additionally, the phenomenon of hot electron injection, which degrades FET performance by changing the characteristics of the FET, becomes a possibility.

Other level shifters from the prior art include those employing a differential amplifier, an example of which is shown in FIG. 2. In this circuit, a bias voltage $V_{BIAS}$ drives the gate of an N-FET $N_{SOURCE}$, to implement a constant current source 200. Connected in series with current source 200 is a left-hand branch 210. (consisting of a first load FET $P_{LD1}$ and a first input FET $N_{IN1}$), in parallel with a right-hand branch 220 (formed from a second load FET $P_{LD2}$ and a second input FET $N_{IN2}$). A reference voltage $V_{REF}$ is used in right-hand branch 220 as a threshold against which an input signal $V_{IN}$, used by left-hand branch 210, is compared. If $V_{IN}$ is less than $V_{REF}$, more current flows in right-hand branch 220 than in left-hand branch 210, causing node 230 to be pulled toward ground. Node 230, in turn, is input to a digital buffer 240, which converts the substantially analog signal on node 230 into a digital output signal $V_{OUT}$ with a voltage swing between ground and $V_{DDH}$. With $V_{IN}$ less than $V_{REF}$, output signal $V_{OUT}$ will be at a logic LOW, or essentially ground. Conversely, $V_{IN}$ being greater than $V_{REF}$ causes less current to flow in right-hand branch 220, thus causing node 230 to be pulled toward $V_{DDH}$. Digital buffer 240 then converts the analog signal of node 230 to a digital HIGH level of $V_{DDH}$ at $V_{OUT}$. The disadvantage of this circuit is similar to those of the level shifter of FIG. 1: static current being drawn, resulting in increased power consumption and heat generation. Additionally, the circuit of FIG. 2 requires an extremely stable reference voltage $V_{REF}$. Furthermore, the like components of left-hand branch 210 and right-hand branch 220 must be closely matched in size, making the physical layout of branches 210 and 220 critical.

In addition to the aforementioned problems, neither of the level shifting circuits of FIG. 1 or FIG. 2 offers any input hysteresis. In other words, a value of input signal $V_{IN}$ which causes a change in output signal $V_{OUT}$ is the same regardless of whether input signal $V_{IN}$ changes from a logic LOW to HIGH, or from HIGH to LOW. Input hysteresis is valuable in noise-prone environments, and especially when using low-voltage digital logic technologies, such as those mentioned earlier, since digital signals with low-voltage swings typically allow small amounts of noise to force a signal past the threshold voltage for that logic family.

Other voltage level shifters other than those mentioned above have been developed over the years, and, by way of example, various forms of such devices can be found in U.S. Pat. Nos. 4,486,670, 4,501,978, 5,742,183, and 6,005,432.

From the foregoing, it is apparent that a need exists for a digital voltage level circuit, which converts lower-voltage-swing digital signals, to those of a higher voltage swing, while at the same time producing essentially no static current, thereby consuming less power and generating less heat. It is also desirable for such a circuit to require no reference voltage, to require no special layout considerations, and to provide some input hysteresis to protect against false logic triggering by local noise sources.

SUMMARY OF THE INVENTION

Embodiments of the invention, to be discussed in detail below, convert a digital signal with a low-voltage swing to a digital signal with a relative high-voltage swing without consuming power by way of static current. Also, no special layout considerations are required, and input hysteresis is provided to counteract the effects of noise injected into the input signal.

In one embodiment of the invention, the input signal drives a first and second input signal inverter of the voltage level shifter apparatus simultaneously. The first inverter transforms the input signal into a logically inverted form of the input signal with a high-voltage swing, while the second inverter transforms the input signal into a logically inverted signal with a relatively lower voltage swing. It is this low-voltage-swing inverter that helps provide the hysteresis exhibited by the embodiments of the invention. A third inverter is then used to invert the high-voltage-swing signal so that the proper high-voltage-swing output signal is produced. Both the high-voltage-swing signals and the low-voltage-swing signals are used to drive a feedback unit. This feedback unit, in turn, produces a feedback signal for controlling a pull-up device responsible for delivering power to the first inverter. When necessary, as will be discussed later, the pull-up device shuts off power to the first high-voltage inverter so that the voltage level shifter will draw no static current.

Other aspects and advantages of the invention will become apparent from the following detailed description, taken in conjunction with the accompanying drawings, illustrating by way of example the principles of the invention.

DETAILED DESCRIPTION

Figure 1:
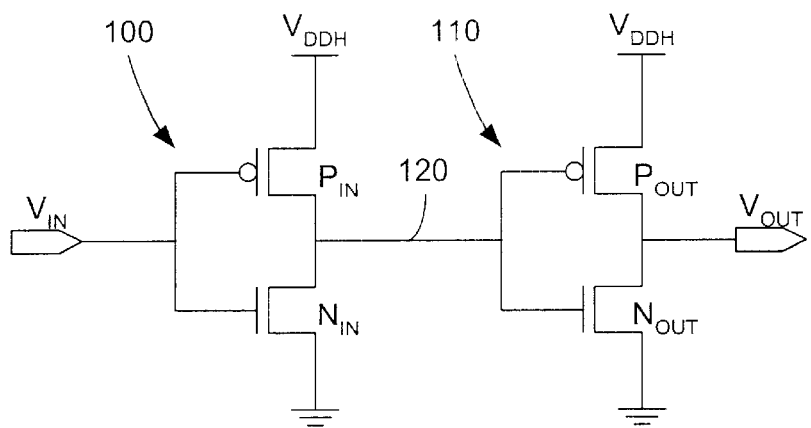
FIG. 1 is a schematic diagram of a first digital level shift circuit from the prior art.
Figure 2:
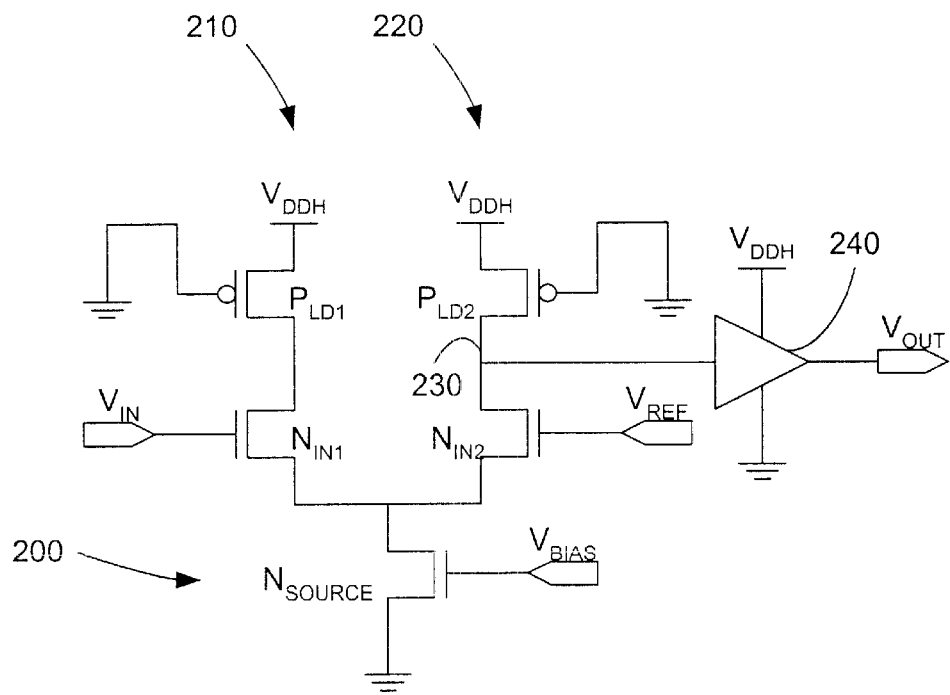
FIG. 2 is a schematic diagram of a second digital level shift circuit from the prior art.
Figure 3:
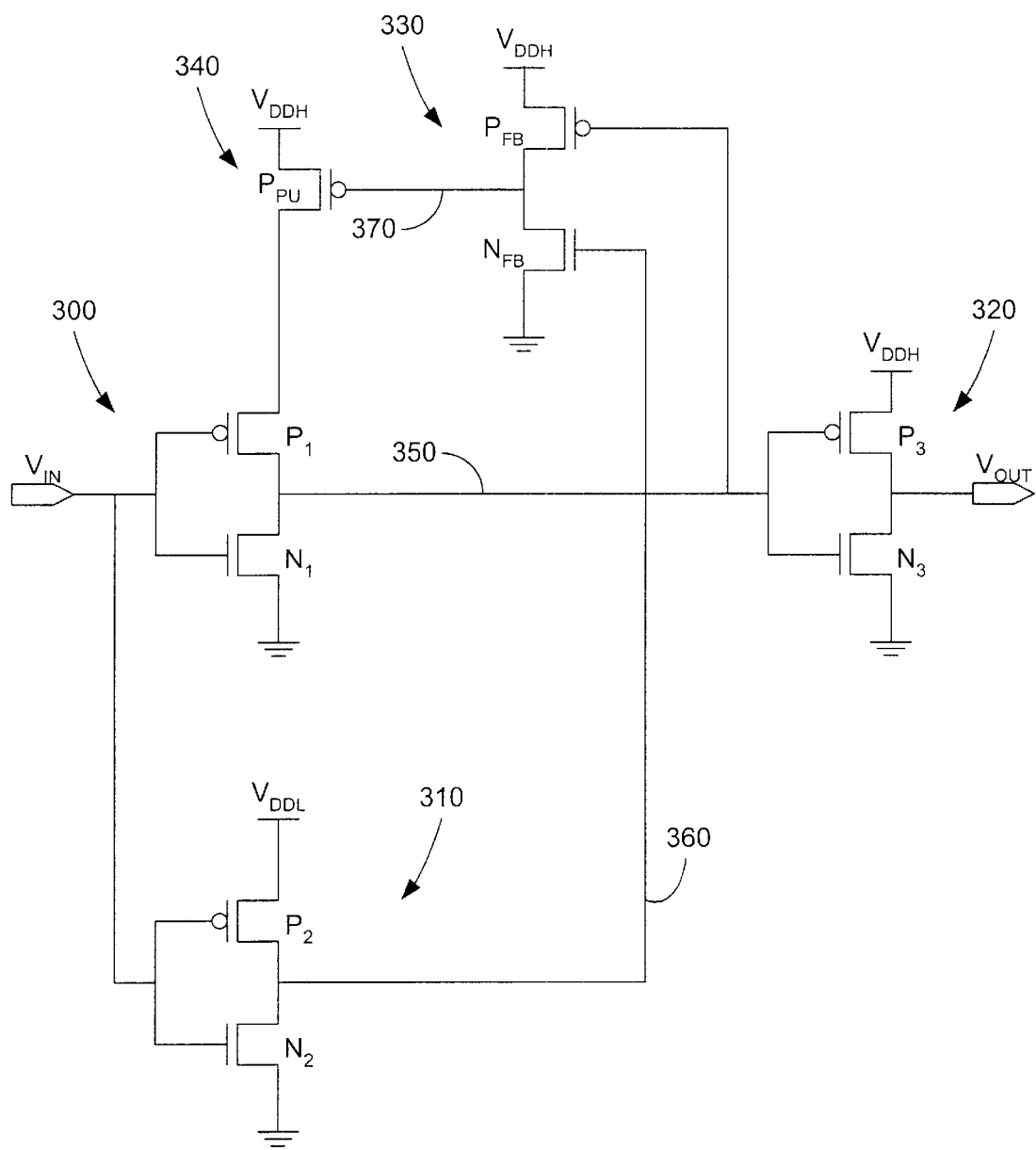
FIG. 3 is a schematic diagram of a digital level shift circuit according to an embodiment of the invention.

One embodiment of the invention is displayed in FIG. 3. A digital low-voltage-swing input signal to be shifted is represented by an input signal $V_{IN}$, which, in this case, is a digital signal that exhibits a logic LOW level of ground, or zero volts, and a HIGH level of a low voltage supply $V_{DDL}$. The level shifter generates an output signal $V_{OUT}$, which is a digital signal having a LOW level of ground and a HIGH level of a high voltage supply $V_{DDH}$, where $V_{DDH}$ is greater than $V_{DDL}$. In one embodiment, $V_{DDH}$ is 3.3V, while $V_{DDL}$ is 1.5V. Many other combinations for $V_{DDH}$ and $V_{DDL}$, respectively, are also possible, such as 3.3V and 2.5V, 2.5V and 1.8V, and so on. Additionally, other embodiments of the invention exist such that the LOW level voltage can be positive or negative compared to some arbitrary ground reference, as long as $V_{DDH}$ and $V_{DDL}$ are both at a higher voltage potential than the LOW level voltage.

From the embodiment of FIG. 3, $V_{IN}$ drives two inverters: a first inverter 300 and a second inverter 310, which are composed of complementary MOS FET pairs connected in series as CMOS inverters. For example, first inverter 300 is made up of a p-channel FET $P_1$ connected in series with an n-channel FET $N_1$. The gate terminals of $P_1$ and $N_1$ are connected together and constitute the input of first inverter 300, and the drain terminals of $P_1$ and $N_1$ are tied together to provide the inverter output. To provide power for first inverter 300, the source terminal of $N_1$ is connected to ground, and the source of $P_1$ is connected indirectly to high voltage supply $V_{DDH}$ by way of pull-up device 340. (The use of pull-up device 340 will be discussed in detail below.) The output of first inverter 300 drives both a third inverter 320, and an input of a feedback unit 330, to be discussed later.

A second inverter 310 is, in the embodiment of FIG. 3, made up of the same type of CMOS inverter used for first inverter 300. In this particular case, p-channel FET $P_2$ and n-channel FET $N_2$ form second inverter 310. The source of $P_2$ is attached to low voltage supply $V_{DDL}$, while the source of $N_2$ is connected to ground. As stated earlier, second inverter 310 is driven by input signal $V_{IN}$. In turn, the output of second inverter 310 drives a second input of feedback unit 330.

Third inverter 320, in the embodiment of FIG. 3, is another CMOS inverter, made of p-channel FET $P_3$ and n-channel FET $N_3$, with its output generating output signal $V_{OUT}$.

Feedback unit 330 provides a way of using the outputs of first inverter 300 and second inverter 310 to control pull-up device 340. In the embodiment shown in FIG. 3, a p-channel FET $P_{FB}$ and an n-channel FET $N_{FB}$ are connected in series at their respective drains, which are also connected to the input of pull-up device 340. The source of $P_{FB}$ is attached to $V_{DDH}$, while the source of $N_{FB}$ is connected to ground. Unlike a CMOS inverter, the gates of $P_{FB}$ and $N_{FB}$ are not tied together; instead, the gate of $P_{FB}$ is tied to the output of first inverter 300, while the gate of $N_{FB}$ is tied to second inverter 310.

Finally, pull-up device 340, in the embodiment of FIG. 3, comprises a single p-channel FET $P_{PU}$. The source of $P_{PU}$ is tied to high voltage supply $V_{DDH}$, while the associated drain is tied to the source of $P_1$ of first inverter 300. The source-to-drain path of $P_{PU}$ selectively provides a power connection between first inverter 300 and high-voltage supply $V_{DDH}$, based on the state of the output of feedback unit 330 being attached to the gate of $P_{PU}$. During times when the gate of $P_{PU}$ is pulled toward ground, $P_{PU}$ conducts, or is ON, therefore connecting high voltage supply $V_{DDH}$ with first inverter 300. Otherwise, the gate of $P_{PU}$ is pulled toward $V_{DDH}$, thereby turning OFF $P_{PU}$, and isolating high-voltage supply $V_{DDH}$ from first inverter 300, which prohibits any potential static current to flow through $P_1$ and $N_1$ to ground.

To fully understand the benefits of the digital voltage level shift circuit of FIG. 3, a step-by-step analysis of its operation is instructive. Beginning with $V_{IN}$ at a voltage level of zero volts, or a LOW logic state, then $N_1$ is OFF, and $P_1$ is ON. If node 370 is initially in a HIGH state of $V_{DDH}$ volts, $P_{PU}$ is OFF, causing node 350 to float, or not being driven to any particular voltage, since the source of $P_1$ is not connected with $V_{DDH}$ at that time. Concurrently, $V_{IN}$ being LOW also causes $N_2$ to be OFF and $P_2$ to be ON, thereby raising node 360 to a logic HIGH of $V_{DDL}$ volts. As a result, $N_{FB}$ is turned ON, thus pulling node 370 substantially to ground, which turns ON $P_{PU}$ and supplies the source of $P_1$ with $V_{DDH}$ volts. Since $P_1$ is ON, node 350 is pulled up to $V_{DDH}$ volts as well, causing $P_3$ to turn OFF, and $N_3$ to turn ON. As a result, output signal $V_{OUT}$ is pulled to ground, which matches the level of $V_{IN}$. Node 350 being at $V_{DDH}$ volts also causes $P_{FB}$ to turn OFF, thereby eliminating any static current that may flow through $P_{FB}$ and $N_{FB}$.

Analyzing the case when $V_{IN}$ rises to a logic HIGH of $V_{DDL}$ volts, FET $N_1$ turns ON, but $P_1$ does not completely turn OFF initially since the source of $P_1$ is at a voltage level of $V_{DDH}$ volts. Thus, static current flows through $P_{PU}$, $P_1$, and $N_1$ temporarily. Given the nature of normal CMOS processes that are well-known in the art, n-channel FETs have approximately twice the current sinking and sourcing capability of identically-sized p-channel FETs. Additionally, the circuit of FIG. 3 has two p-channel FETs, $P_1$ and $P_{PU}$, connected in series, thereby further reducing the "strength" of $P_1$ and $P_{PU}$ in comparison to $N_1$. Therefore, $N_1$ succeeds in pulling node 350 substantially to ground. $V_{IN}$ also turns $N_2$ ON and $P_2$ completely OFF (since the source of $P_2$ is attached to $V_{DDL}$), thus pulling node 360 substantially to ground. With the gates of both $P_{FB}$ and $N_{FB}$ pulled LOW, node 370 is pulled up substantially to $V_{DDH}$ volts, thereby shutting OFF $P_{PU}$ and eliminating the static current that previous flowed through $P_{PU}$, $P_1$, and $N_1$, and terminating the drive fight between $P_1$ and $N_1$. Also, with node 350 being substantially at zero volts, $P_3$ is ON, $N_3$ is OFF, and $V_{OUT}$ is pulled up to $V_{DDH}$ volts, all in response to $V_{IN}$ rising to $V_{DDL}$ volts.

To complete the description of the entire cycle, assume input signal $V_{IN}$ returns to zero volts. In response, FETs $P_1$ and $P_2$ turn ON, and $N_1$ and $N_2$ turn OFF completely, causing node 360 to be raised to $V_{DDL}$ volts once again. As a result, $N_{FB}$ is turned ON, causing $P_{PU}$ to turn back ON, thus raising node 350 to $V_{DDH}$ volts, turning off $P_{FB}$ in the process to once again eliminate static current through $P_{FB}$ and $N_{FB}$. Also, the gates of $P_3$ and $N_3$ are pulled to $V_{DDH}$, causing $N_3$ to turn ON, $P_3$ to turn OFF completely, and $V_{OUT}$ to be pulled substantially to ground, thereby following the logic state of $V_{IN}$.

Additionally, the embodiment of FIG. 3 exhibits hysteresis as a result of first inverter 300 being connected with high voltage supply $V_{DDH}$ while second inverter 310 is coupled with low voltage supply $V_{DDL}$. When $V_{IN}$ is transitioning from a LOW to a HIGH logic state, $V_{IN}$ must reach a voltage that is typically close to the midpoint between $V_{DDH}$ and zero so that $N_1$ may win the drive fight with $P_1$, as described earlier, so that node 350 may attain substantially zero volts, since the source of $P_1$ is at a voltage level of about $V_{DDH}$ volts. This voltage required for $V_{IN}$ to be considered a HIGH, which is related somewhat to the relative size of $P_1$ compared to $N_1$, is typically higher than the voltage required for $V_{IN}$ to be perceived as a LOW state when transitioning from the HIGH state, according to the operation of the embodiment of FIG. 3. For $V_{OUT}$ to go LOW, $V_{IN}$ must be close enough to ground to shut OFF $N_2$ and turn ON $P_2$ sufficiently for $N_{FB}$ to turn ON and start the process of switching $V_{OUT}$ from a logic HIGH to a logic LOW, since the source of $P_2$ is attached to low-voltage supply $V_{DDL}$. Hence, with a higher voltage required of $V_{IN}$ to switch $V_{OUT}$ HIGH when compared to the voltage required to switch $V_{OUT}$ LOW, the voltage level shifter of FIG. 3 thus exhibits hysteresis.

Up to this point, it has been assumed that all p-channel and n-channel FETs of the embodiment of FIG. 3 are essentially the same size. However, in other embodiments of the invention, it may be desirable to change the size of the FETs in relation to each other to improve certain performance characteristics of the voltage level shifter. For example, it may be desirable to make $N_1$ larger than $P_1$ to further ensure that $N_1$ wins the drive fight with $P_1$ when Vin rises to $V_{DDL}$, as described earlier. Similarly, it may be advantageous for $P_2$ to be made larger than $N_2$, and for $N_3$ to made larger than $P_3$, so that the switching voltages for second inverter 310 and third inverter 320 are modified to decrease the switching time involved when $V_{IN}$ rises to $V_{DDL}$. $N_{FB}$ may also be made larger than $P_{FB}$ toward the same timing goal. The particular timing needs of an electronic circuit that includes the voltage level shifter of FIG. 3 can be used to determine the appropriate sizes of the FETs used.

From the foregoing, it will be apparent that the invention provides a simple digital voltage level shifting circuit that consumes virtually no static current while the input signal of the shifter maintains a stable logic state. Additionally, input hysteresis is provided by embodiments of the invention so that the generated output signal is resistant to the effects of noise at the input of the level shifter. Embodiments other than that shown in FIG. 3 are also possible. As a result, the invention is not to be limited to the specific forms and arrangement of components so described and illustrated; the invention is limited only by the claims.

What is claimed is:

1. A digital voltage level shifter that converts an input signal with a small voltage swing to an output signal with a large voltage swing, the digital voltage level shifter comprising:
    first means for inverting the input signal to generate an inverted high-voltage-swing signal;
    second means for inverting the input signal to generate an inverted low-voltage-swing signal;
    third means for inverting the inverted high-voltage-swing signal to generate the output signal; and
    means for selectively providing a high voltage supply to the first inverting means, such that the high voltage supply is electrically isolated from the first inverting means when both the inverted high-voltage-swing signal and the inverted low-voltage swing signal are in a LOW logic state.

2. The digital voltage level shifter of claim 1, wherein the first inverting means comprises an n-channel FET and a p-channel FET connected in series as a complementary MOS pair.

3. The digital voltage level shifter of claim 2, wherein the n-channel FET is larger than the p-channel FET.

4. The digital voltage level shifter of claim 1, wherein the second inverting means comprises an n-channel FET and a p-channel FET connected in series as a complementary MOS pair.

5. The digital voltage level shifter of claim 4, wherein the p-channel FET is larger than the n-channel FET.

6. The digital voltage level shifter of claim 4, wherein the complementary MOS pair is coupled across a low voltage supply and a ground reference.

7. The digital voltage level shifter of claim 1, wherein the third inverting means comprises an n-channel FET and a p-channel FET connected in series as a complementary MOS pair.

8. The digital voltage level shifter of claim 7, wherein the n-channel FET is larger than the p-channel FET.

9. The digital voltage level shifter of claim 7, wherein the complementary MOS pair is coupled across the high voltage supply and a ground reference.

10. The digital voltage level shifter of claim 1, wherein the providing means comprises a first p-channel FET connected in a series combination at a feedback node with an n-channel FET, the first p-channel FET having a gate driven by the inverted high-voltage-swing signal, and the n-channel FET having a gate driven by the inverted low-voltage-swing signal, the providing means further comprising a second p-channel FET having a gate connected with the feedback node, the second p-channel FET having a source-to-drain channel connecting the high voltage supply with the first inverting means.

11. The digital voltage level shifter of claim 10, wherein the n-channel FET is larger than the first p-channel FET.

12. The digital voltage level shifter of claim 10, wherein the series combination of the first p-channel FET and the n-channel FET is coupled across the high voltage supply and a ground reference.

13. A digital voltage level shifter that converts an input signal with a small voltage swing to an output signal with a large voltage swing, the digital voltage level shifter comprising:
    a first inverter, being driven by the input signal, the first inverter being configured to generate an inverted high-voltage-swing signal;

a second inverter, being driven by the input signal, the second inverter being configured to generate an inverted low-voltage-swing signal;

a third inverter, being driven by the inverted high-voltage-swing signal, the third inverter being configured to generate the output signal;

a pull-up device, having a control input, the pull-up device being configured to provide a high voltage supply to the first inverter when enabled via the control input; and a feedback control circuit, being driven by the inverted high-voltage-swing signal and the inverted low-voltage-swing signal, the feedback control circuit being configured to generate a feedback signal for the control input of the pull-up device such that the pull-up device isolates the high voltage supply from the first inverter when the inverted high-voltage-swing signal and the inverted low-voltage-swing signal are both in a LOW logic state.

14. The digital voltage level shifter of claim 13, wherein the first inverter comprises an n-channel FET and a p-channel FET connected in series as a complementary MOS pair.

15. The digital voltage level shifter of claim 14, wherein the n-channel FET is larger than the p-channel FET.

16. The digital voltage level shifter of claim 13, wherein the second inverter comprises an n-channel FET and a p-channel FET connected in series as a complementary MOS pair.

17. The digital voltage level shifter of claim 16, wherein the p-channel FET is larger than the n-channel FET.

18. The digital voltage level shifter of claim 16, wherein the complementary MOS pair is coupled across a low voltage supply and a ground reference.

19. The digital voltage level shifter of claim 13, wherein the third inverter comprises an n-channel FET and a p-channel FET connected in series as a complementary MOS pair.

20. The digital voltage level shifter of claim 19, wherein the n-channel FET is larger than the p-channel FET.

21. The digital voltage level shifter of claim 19, wherein the complementary MOS pair is coupled across the high voltage supply and a ground reference.

22. The digital voltage level shifter of claim 13, wherein the pull-up device comprises a p-channel FET having a gate acting as the control input of the pull-up device.

23. The digital voltage level shifter of claim 13, wherein the feedback control circuit unit comprises a p-channel FET connected in series combination at a feedback node to an n-channel FET, the p-channel FET having a gate driven by the inverted high-voltage-swing signal, and the n-channel FET having a gate driven by the inverted low-voltage-swing signal, wherein the feedback signal is generated at the feedback node.

24. The digital voltage level shifter of claim 23, wherein the n-channel FET is larger than the p-channel FET.

25. The digital voltage level shifter of claim 23, wherein the series combination of the p-channel FET and the n-channel FET is coupled across the high voltage supply and a ground reference.

26. A digital voltage level shifter that converts an input signal with a small voltage swing to an output signal with a large voltage swing, the digital voltage level shifter comprising:

a first n-channel FET and a first p-channel FET connected in series as a first complementary MOS inverter, the gates of the first n-channel FET and the first p-channel FET being driven by the input signal, the source of the first n-channel FET being connected with a ground reference;

a second n-channel FET and a second p-channel FET connected in series as a second complementary MOS inverter, the gates of the second n-channel FET and the second p-channel FET being driven by the input signal, the source of the second p-channel FET being connected with a low voltage supply, the source of the second n-channel FET being connected with the ground reference;

a third n-channel FET and a third p-channel FET connected in series as a third complementary MOS inverter, the gates of the third n-channel FET and the third p-channel FET being driven by the drains of the first n-channel FET and the first p-channel FET, the source of the third p-channel FET being connected with a high voltage supply, the source of the n-channel FET being connected with the ground reference, the drains of the third n-channel FET and the third p-channel FET generating the output signal;

a fourth p-channel FET, the source of the fourth p-channel FET being connected with the high voltage supply, the drain of the fourth p-channel FET being connected with the source of the first p-channel FET; and a fourth n-channel FET and a fifth p-channel FET connected in series so that drains of the fourth n-channel FET and the fifth p-channel FET are both connected to the gate of the fourth p-channel FET, the source of the fifth p-channel FET being connected with the high voltage supply, the source of the fourth n-channel FET being connected with the ground reference, the gate of the fifth p-channel FET being connected with the drains of the first n-channel FET and the first p-channel FET, the gate of the fourth n-channel FET being connected with the drains of the second n-channel FET and the second p-channel FET.

27. A method of converting a digital input signal with a small voltage swing to a digital output signal with a large voltage swing, the method comprising the steps of:

inverting the digital input signal to generate an inverted digital high-voltage-swing signal;

inverting the digital input signal to generate an inverted digital low-voltage-swing signal;

inverting the inverted digital high-voltage-swing signal to generate the digital output signal; and feeding back the inverted digital high-voltage-swing signal and the inverted digital low-voltage-swing signal as control inputs to a pull-up device configured to disable a static electrical current path existing as a result of the step of inverting of the digital input signal to generate the inverted digital high-voltage-swing signal, such that the static electrical current path is disabled when the inverted digital high-voltage-swing signal and the inverted digital low-voltage-swing signal are both in a LOW logic state.

* * * * *